United States Patent
Kim et al.

(10) Patent No.: US 12,529,959 B2
(45) Date of Patent: Jan. 20, 2026

(54) MULTI-REACTIVE PHOTOSENSITIVE NANOCOMPOSITE FILM AND BIOELECTRIC STIMULATION SYSTEM USING INDEPENDENT MULTI-STATES

(71) Applicant: Industry-Academic Cooperation Foundation, Yonsei University, Seoul (KR)

(72) Inventors: Jiwon Kim, Seoul (KR); Jiyeon Lee, Incheon (KR); Seoyeah Oh, Bucheon-si (KR); Jihyeon Park, Incheon (KR); Dongjun Kim, Incheon (KR); Geonho Kim, Jeonju-si (KR); Seoyoung Yoon, Cheonan-si (KR); Hyunbin Park, Incheon (KR); Jaehyeok Ryu, Siheung-si (KR)

(73) Assignee: Industry-Academic Cooperation Foundation, Yonsei University, Seoul (KR)

( * ) Notice: Subject to any disclaimer, the term of this patent is extended or adjusted under 35 U.S.C. 154(b) by 721 days.

(21) Appl. No.: 17/946,388

(22) Filed: Sep. 16, 2022

(65) Prior Publication Data
US 2023/0090646 A1    Mar. 23, 2023

(30) Foreign Application Priority Data

Sep. 17, 2021  (KR) ......................... 10-2021-0124799
Sep. 14, 2022  (KR) ......................... 10-2022-0115817

(51) Int. Cl.
*G03F 7/11*     (2006.01)
*C09K 11/06*    (2006.01)

(52) U.S. Cl.
CPC ............... *G03F 7/11* (2013.01); *C09K 11/06* (2013.01); *C09K 2211/188* (2013.01)

(58) Field of Classification Search
CPC ...... G03F 7/11; C09K 11/06; C09K 2211/188
See application file for complete search history.

(56) References Cited

U.S. PATENT DOCUMENTS

2006/0023327 A1* 2/2006 Coombs ............... G02B 5/0816
                                                     359/883
2009/0294692 A1* 12/2009 Bourke, Jr ............ A61L 2/0076
                                                     250/492.1

(Continued)

FOREIGN PATENT DOCUMENTS

KR    1020000061859 A    10/2000
KR       101908774 B1    10/2018

(Continued)

OTHER PUBLICATIONS

Kim et al., National Nanotechnology Policy Center, 2019, pp. 1-10. (English-Language Machine Translation of Abstract).

(Continued)

*Primary Examiner* — Christopher A Flory
(74) *Attorney, Agent, or Firm* — The Webb Law Firm

(57) ABSTRACT

The present invention relates to a multi-response photosensitive nanocomposite film that may exhibit independent responses of bending and light emission by light stimuli with different wavelengths. The multi-response photosensitive nanocomposite film may induce independent optical bending and light emission when light stimuli with different wavelengths are applied, such that electrical stimulation and location detection may be independently and simultaneously performed in vivo.

16 Claims, 10 Drawing Sheets

(56) References Cited

U.S. PATENT DOCUMENTS

| | | | | |
|---|---|---|---|---|
| 2009/0309094 | A1* | 12/2009 | Frey | H05B 33/20 |
| | | | | 257/E51.026 |
| 2010/0261263 | A1* | 10/2010 | Vo-Dinh | B82Y 20/00 |
| | | | | 977/773 |
| 2011/0046262 | A1* | 2/2011 | Bublewitz | A61K 6/18 |
| | | | | 523/121 |
| 2014/0234157 | A1* | 8/2014 | Chen | B22F 9/24 |
| | | | | 427/125 |
| 2014/0243934 | A1* | 8/2014 | Vo-Dinh | A61P 9/10 |
| | | | | 607/88 |
| 2015/0251016 | A1 | 9/2015 | Vo-Dinh et al. | |
| 2016/0151747 | A1* | 6/2016 | Jungbauer | B01D 71/601 |
| | | | | 210/500.33 |
| 2016/0260917 | A1* | 9/2016 | Forrest | H10K 71/80 |
| 2017/0107413 | A1* | 4/2017 | Wang | C09D 183/00 |
| 2017/0239489 | A1* | 8/2017 | Bourke, Jr. | A61N 5/062 |
| 2018/0340174 | A1* | 11/2018 | Lundorf | C12N 15/1065 |
| 2019/0001024 | A1* | 1/2019 | Grubbs | A61L 27/047 |
| 2019/0006031 | A1* | 1/2019 | Hyde | G16H 40/20 |
| 2019/0043282 | A1* | 2/2019 | Hyde | A61B 5/489 |
| 2019/0043283 | A1* | 2/2019 | Hyde | A61B 5/1171 |
| 2020/0356003 | A1* | 11/2020 | Kitajima | G02B 5/223 |
| 2021/0138071 | A1* | 5/2021 | Santos | A61K 38/47 |
| 2021/0228684 | A1* | 7/2021 | Delisle | A61P 27/02 |

FOREIGN PATENT DOCUMENTS

| | | |
|---|---|---|
| KR | 1020190035279 A | 4/2019 |
| KR | 1020200042873 A | 4/2020 |
| KR | 1020200050440 A | 5/2020 |

OTHER PUBLICATIONS

Lee et al., "Light-induced Electrical Switch via Photo-responsive Nanocomposite Film", Sensors and Actuators B: Chemical, 2018, pp. 1-18.

Ryu et al., "Near-infrared/Visible Light Induced Spatio-temporal Electrical Switch via Independent Multi-states of Photoresponsive Nanocomposite", TS07 Nanoelectronic Devices, 2021 Nano Korea: The 19th International Nanotech Symposium & Exhibition, Jul. 9, 2021, pp. 1-17.

* cited by examiner

MULTI-REACTIVE PHOTOSENSITIVE NANOCOMPOSITE FILM AND BIOELECTRIC STIMULATION SYSTEM USING INDEPENDENT MULTI-STATES

CROSS-REFERENCE TO RELATED APPLICATIONS

This application claims priority to Korean Patent Application Nos. 10-2021-0124799 filed Sep. 17, 2021 and 10-2022-0115817 filed Sep. 14, 2022, the disclosures of which are hereby incorporated by reference in their entirety.

BACKGROUND OF THE INVENTION

Field of the Invention

The following disclosure relates to a multi-response photosensitive nanocomposite film that may exhibit independent responses of bending and light emission by light stimuli with different wavelengths.

Description of Related Art

Organic and inorganic nanocomposite materials are materials that may realize a wide range of properties by combining contrasting properties of organic and inorganic materials. Furthermore, functional properties of these nanocomposite materials may be manipulated by a stimulus such as light, a chemical stimulus, an electromagnetic field, a mechanical force, or heat. When the properties of the nanocomposite material may be significantly changed by applying such a stimulus, the nanocomposite material may be applied to a switch. In this case, a switchable material should exhibit clearly different properties depending on the presence or absence of a stimulus, and a reversible mechanism should be involved in the switchable material. A nanocomposite material that satisfies these conditions may be used in various fields such as a sensor, a photodetector, a memory device, and a drug delivery system.

Light is a useful stimulus because it may be remotely controlled according to a wavelength without coming into direct contact with the material. Therefore, the light-switchable nanocomposite material using light as a stimulus has been used in various fields such as a photocatalyst, a drug delivery system, and an energy conversion device. Furthermore, it is possible to expand the field of application by inducing a complex response by sequentially or simultaneously applying stimuli accompanying one or more responses.

However, there are several factors to consider when applying such a photoreactive material to a living body. In particular, a wavelength range of the applied light needs to be carefully selected so as not to harm the living body. Specifically, high-energy ultraviolet light may penetrate the skin and cause damage to cells, resulting in damage to the skin, eyes, and immune system. Therefore, in designing the nanocomposite material using light as a stimulus, it is important to avoid the use of the ultraviolet light as much as possible.

Accordingly, research and development of a multi-response photosensitive nanocomposite film that may be remotely controlled by light with different wavelengths without using high-energy ultraviolet light is still required.

SUMMARY OF THE INVENTION

An embodiment of the present invention is directed to providing a multi-response photosensitive nanocomposite film capable of implementing independent control of bending and light emission by light with different wavelengths.

Another embodiment of the present invention is directed to providing a multi-response photosensitive nanocomposite film that may be used as a bioelectric stimulation system using visible light or near-infrared light instead of ultraviolet light.

In one general aspect, a multi-response photosensitive nanocomposite film includes: an electrically conductive layer; a biocompatible natural polymer support layer disposed on the electrically conductive layer; and a polydimethylsiloxane (AzoPDMS) polymer layer disposed on the biocompatible natural polymer support layer and containing an azobenzene group, the electrically conductive layer, the biocompatible natural polymer support layer, and the AzoPDMS polymer layer being sequentially disposed, wherein nanoparticles doped with a rare earth metal are included in the AzoPDMS polymer layer.

The electrically conductive layer may have a network structure of metal nanowires.

The rare earth metal may be selected from the group consisting of La, Ce, Pr, Nd, Pm, Sm, Edu, Gd, Tb, Dy, Ho, Er, Tm, Yb, and Lu.

The nanoparticles may be perovskite quantum dots (PQDs), and crystal particles of the perovskite quantum dots may have a structure of the following Chemical Formula 1:

$$ABX_aZ_{3-a} \qquad \text{<Chemical Formula 1>}$$

in Chemical Formula 1, A is a monovalent metal cation, B is a divalent metal cation, X and Z are halogen ions, and a is a real number of 0 to 3.

The nanoparticles may be transparent nanoparticles, and the transparent nanoparticles may contain a compound represented by $MYF_4$ (M is an alkali metal).

In the multi-response photosensitive nanocomposite film, a bending phenomenon may occur by a light stimulus, and when the light stimulus is removed, the bending phenomenon may be reversibly removed. The light stimulus may be a visible light source.

The nanoparticles doped with the rare earth metal may have visible light emission properties by a near-infrared light stimulus, and a bending phenomenon may occur by a light stimulus of the emitted visible light.

In another general aspect, a method of producing a multi-response photosensitive nanocomposite film includes: a step (a) of preparing a first solution containing an azobenzene derivative and a polydimethylsiloxane precursor polymer; a step (b) of preparing a second solution containing nanoparticles doped with a rare earth metal; a step (c) of forming a nanocomposite double-layer by applying a mixed solution of the first solution and the second solution onto a biocompatible natural polymer support layer; and a step (d) of forming an electrically conductive layer on the biocompatible natural polymer support layer of the nanocomposite double-layer formed in the step (c).

The azobenzene derivative may contain a vinyl group at a terminal thereof.

In the step (c), the mixed solution may further contain a curing agent, and a step of curing the polydimethylsiloxane precursor polymer may be included. The electrically conductive layer may be formed by applying a metal nanowire solution.

In still another general aspect, a bioelectric stimulation system includes the multi-response photosensitive nanocomposite film.

Other features and aspects will be apparent from the following detailed description, the drawings, and the claims.

DESCRIPTION OF THE INVENTION

Figure 1:
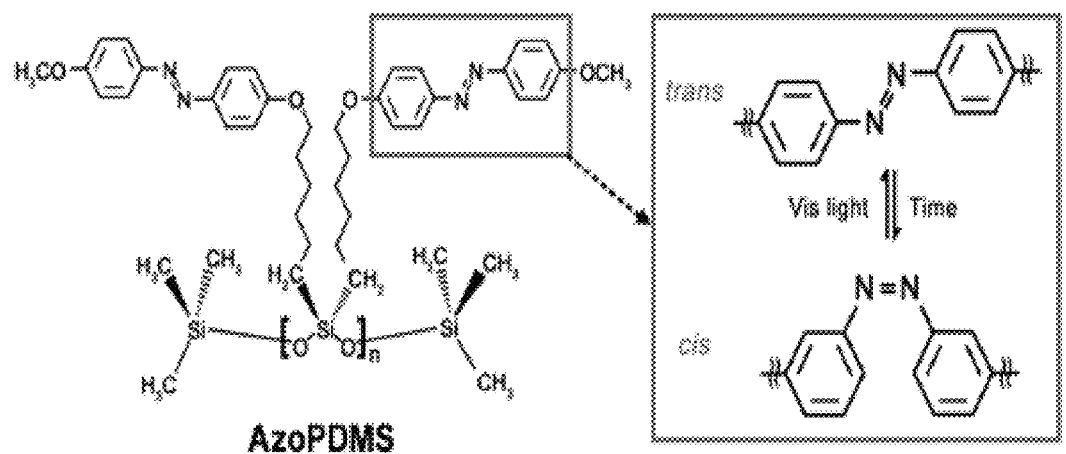
FIG. 1 is a schematic view illustrating a change in shape of an azobenzene molecule to induce a bending phenomenon of a film.

Hereinafter, a multi-response photosensitive nanocomposite film of the present invention will be described in detail with reference to the accompanying drawings.

The drawings to be provided below are provided by way of example so that the spirit of the present invention can be sufficiently transferred to those skilled in the art. Therefore, the present invention is not limited to the drawings to be provided below, but may be modified in many different forms. In addition, the drawings suggested below may be exaggerated in order to clear the spirit of the present invention.

Technical terms and scientific terms used herein have the general meanings understood by those skilled in the art to which the present invention pertains unless otherwise defined, and a description for the known function and configuration unnecessarily obscuring the gist of the present invention will be omitted in the following description and the accompanying drawings.

Unless the context clearly indicates otherwise, singular forms used in the present specification and the scope of the appended claims are intended to include plural forms.

The terms "first", "second", and the like in the present specification and the scope of the appended claims are not used as limiting meanings, but are used to distinguish one component from another component.

The terms "comprise(s)", "include(s)", "have (has)", and the like used in the present specification and the scope of the appended claims indicate the presence of features or components described in the specification, and do not preclude the addition of one or more other features or components, unless specifically limited.

In the present specification and the scope of the appended claims, it will be understood that when an element such as a film (layer), a region, or a component is referred to as being "on" or "above" another element, it may be directly on another element while being in contact therewith or another film (layer), another region, or another component may be interposed therebetween.

The multi-response photosensitive nanocomposite film according to the present invention includes: an electrically conductive layer; a biocompatible natural polymer support layer disposed on the electrically conductive layer; and a polydimethylsiloxane (AzoPDMS) polymer layer disposed on the biocompatible natural polymer support layer and containing an azobenzene group, the electrically conductive layer, the biocompatible natural polymer support layer, and the AzoPDMS polymer layer being sequentially disposed, wherein nanoparticles doped with a rare earth metal are included in the AzoPDMS polymer layer.

In a specific example, the electrically conductive layer may have a network structure of metal nanowires. In this case, the metal nanowire is a structure formed of a single-crystal metal with high utility value because it has high chemical stability and excellent electrical conductivity. The type of the metal may be selected from the group consisting of gold, silver, copper, aluminum, zinc, and nickel, and may be preferably silver.

The metal nanowire may have a diameter of 10 to 100 nm, preferably 15 to 80 nm, and more preferably 20 to 60 nm. In addition, the metal nanowire may have a length of 3 to 100 μm, preferably 6 to 75 μm, and more preferably 10 to 50 μm.

These metal nanowires may have a densely connected network structure. Preferably, a plurality of metal nanowires may be bonded to each other by photonic sintering to have a network structure in which contact resistance is minimized, and may exhibit improved electrical conductivity by this characteristic.

In a specific example, the type of the biocompatible natural polymer of the biocompatible natural polymer support layer may be selected from the group consisting of agarose, pectin, chitosan, gelatin, collagen, alginate, and silk fibroin, and preferably, may be silk fibroin.

A thickness of the biocompatible natural polymer support layer may be 2 to 20 μm, preferably 4 to 17 μm, more preferably 6 to 14 μm, and most preferably 8 to 10 μm.

The biocompatible natural polymer used for such a biocompatible natural polymer support layer has a high tensile strength and an advantage of being suitable for a living body due to features such as non-inflammatory properties, water solubility, and biodegradability.

In a specific example, the polymer layer disposed on the biocompatible natural polymer support layer may be an azobenzene incorporated polydimethylsiloxane (AzoPDMS) polymer layer containing an azobenzene group.

A thickness of the AzoPDMS polymer layer may be 10 to 30 μm, preferably 12 to 28 μm, more preferably 14 to 26 μm, and most preferably 15 to 25 μm. Therefore, a ratio of the thickness of the biocompatible natural polymer support layer to the thickness of the AzoPDMS polymer layer may be 1:1 to 4, preferably 1:1.5 to 3.5, and more preferably 1:2 to 3.

AzoPDMS may be PDMS in which an azobenzene derivative is covalently bonded to a side chain. The azobenzene derivative may contain various reactive functional groups to be bonded to a main chain of PDMS, and may be bonded to the main chain of PDMS through a known reaction, and thus, it is not limited to a specific reactive functional group. As a specific example, the azobenzene derivative and PDMS may be bonded through a single bond (—$CH_2$—$CH_2$—), an amide bond, an ester bond, a carbamate bond, a urea bond, an ether bond, or a carbonate bond, the azobenzene derivative contains a reactive functional group to form the bond, and PDMS contains a reactive functional group capable of reacting with the reactive functional group, but this is only an example and is not limited thereto. As a non-limiting example, the azobenzene derivative may be 1-(4-(hex-5-ethyloxy)phenyl)-2-phenyldiazene.

When a light stimulus is applied to AzoPDMS, the three-dimensional structure is changed by cis-trans isomerization of the azobenzene derivative. The cis-trans isomerization of the azobenzene derivative causes a volume change of AzoPDMS, which causes a bending phenomenon of AzoPDMS and the biocompatible natural polymer support layer. More specifically, referring to FIG. 1, when AzoPDMS is irradiated with visible light, a cis form of the azobenzene molecule is converted into a trans form, and the volume of AzoPDMS is increased. As the volume of AzoPDMS is increased, a difference in volume between AzoPDMS and the biocompatible natural polymer support layer occurs, which causes a phenomenon in which the film is bent toward the biocompatible natural polymer support layer. When the light stimulus is removed from the bent film, the trans form of the azobenzene molecule is converted back to the cis form, and the volume of AzoPDMS is decreased. As the volume of AzoPDMS is decreased, the bending phenomenon of AzoPDMS and the biocompatible natural polymer support layer is removed.

AzoPDMS is predominantly in the cis form in the initial state when it is not irradiated with light. The trans form predominates in an AzoPDMS prepolymer, whereas the cis form predominates in a cured AzoPDMS film, which occurs because steric hindrance is increased due to crosslinking of the prepolymer and isomerization equilibrium of azobenzene is thus shifted towards the cis form.

As a result, when the nanocomposite film is irradiated with light in a visible wavelength range of 400 to 700 nm, a bending phenomenon of the film occurs in a direction in which the biocompatible natural polymer support layer is folded inward due to the volume change of AzoPDMS, and when the light stimulus is removed, the bending phenomenon of the film is removed and a reversible reaction in which the film is returned to the initial state occurs.

In a specific example, the nanoparticles may be perovskite quantum dots (PQDs). In this case, perovskite crystal particles constituting the perovskite quantum dots may have a structure of the following Chemical Formula 1:

$$ABX_aZ_{3-a} \qquad \text{<Chemical Formula 1>}$$

in Chemical Formula 1, A may be a monovalent metal cation, B may be a divalent metal cation, X and Z may be halogen ions, and a may be a real number of 0 to 3.

More specifically, in Chemical Formula 1, A may be an alkali metal cation, may be selected from the group consisting of $Li^+$, $Na^+$, $K^+$, $Rb^+$, and $Cs^+$, and preferably, may be $Cs^+$.

In addition, B may be a carbon group metal cation, may be $Sn^{2+}$ or $Pb^{2+}$, and preferably, may be $Pb^{2+}$.

In addition, X and Z may be halogen ions, each independently may be selected from the group consisting of $F^-$, $Cl^-$, $Br^-$, and $I^-$, and preferably, may be $Cl^-$ or $Br^-$.

Specifically, the compound represented by Chemical Formula 1 may be selected from the group consisting of $CsPbCl_3$, $CsPbBr_3$, and $CsPbI_3$, and preferably, may be $CsPbCl_3$.

In another specific example, the nanoparticles (NPs) may be transparent nanoparticles. In this case, the transparent nanoparticles may contain a compound represented by $MYF_4$ (M is an alkali metal). More specifically, M may be selected from the group consisting of Li, Na, K, Rb, and Cs, and preferably, may be Na.

The nanoparticles emit light by a light stimulus at a specific wavelength. However, in order to implement a bioelectrical stimulation system using multiple optical switches, it is required to use a light stimulus wavelength band suitable for a living body. Nanoparticles having light-emitting properties under a light stimulus in a high-energy ultraviolet region where a human body is harmed may not be suitable for use as a biological device. Therefore, in order to change the wavelength range of the light stimulus to a low-energy infrared region and determine the location of the film by emitting light in the visible region in real time, it is preferable to use nanoparticles capable of upconversion that receive light of low energy and generate light of high energy. Therefore, nanoparticles doped with a rare earth metal may be preferable for changing the wavelength band.

The nanoparticle may have a diameter of 1 to 50 nm, preferably 5 to 40 nm, and more preferably 10 to 30 nm. In this case, when the nanoparticle has a diameter of 10 to 30 nm, there is an advantage in that the light emission efficiency is maintained while the band gap is not changed depending on a particle size. In addition, the nanoparticles in this case may have a spherical, cylindrical, elliptical, polygonal, one-dimensional linear, or two-dimensional tubular structure.

In addition, the nanoparticles are not circulated inside the living body, but may be fixed in a state surrounded by the solid AzoPDMS polymer layer, such that the nanoparticles are stable and safe even when used in the living body.

In a specific example, the type of the rare earth metal of the nanoparticles doped with the rare earth metal may be selected from the group consisting of La, Ce, Pr, Nd, Pm, Sm, Edu, Gd, Tb, Dy, Ho, Er, Tm, Yb, and Lu, and preferably, may be Yb or Er.

More specifically, near-infrared light may be used as a light stimulus by introducing a photosensitizer that absorbs light having a wavelength of 980 nm, such as $Yb^{3+}$. In addition, when an appropriate emitter such as $Er^{3+}$, photons may be transmitted from the absorbed light having a wavelength of 980 nm and visible light may be emitted. Therefore, when the nanoparticles are doped with two or more rare earth elements (Yb and Er), near-infrared light having a wavelength of 980 nm may be absorbed through energy transfer between the rare earth elements, and may be converted into light in the visible range to be emitted.

The nanoparticles doped with the rare earth metal may be uniformly dispersed in the AzoPDMS polymer layer to exhibit visible fluorescence. As a non-limiting example, when the nanoparticles doped with the rare earth metal are irradiated with light having a wavelength of 980 nm, the nanoparticles doped with the rare earth metal emit visible light having wavelengths of 520.4, 540.8, and 654.8 nm, and such a property is maintained even when the nanoparticles are dispersed in AzoPDMS. That is, the absorption wavelength shifts from the ultraviolet ($\lambda$=365 nm) range to the near-infrared ($\lambda$=980 nm) range through upconversion induced by doping the nanoparticles with the rare earth elements. Thus, it is possible to use light having a wavelength in a range applicable to the bioelectrical stimulation system.

In the case of using ultraviolet light with high energy that harms the human body as an absorption wavelength, although there is a problem that the nanoparticles are not suitable for use as a biological device, there is an advantage that the nanoparticles may be used as a biological device by moving the absorption wavelength to the near-infrared range. In addition, near-infrared light is absorbed and visible light is emitted, such that the location of the film may be detected in real time and intuitively. Therefore, when the nanoparticles are used as a bioelectrical stimulation system, it is possible to simultaneously perform electrical stimulation and location detection.

In addition, a light emission wavelength of the nanoparticles doped with the rare earth elements is a wavelength in the visible light region, and in a case where the polymer layer absorbs light having a wavelength of 400 to 700 nm, the light emission wavelength of the nanoparticles doped with the rare earth elements overlaps with the absorption wavelength band of the polymer layer. Accordingly, near-infrared light is radiated, such that visible light is emitted by the nanoparticles doped with the rare earth elements, and at the same time, the bending phenomenon of the polymer layer occurs by using the emitted visible light as a light stimulus, which may be more preferable.

The present invention provides a method of producing a multi-response photosensitive nanocomposite film, the method including: a step (a) of preparing a first solution containing an azobenzene derivative and a polydimethylsiloxane precursor polymer; a step (b) of preparing a second solution containing nanoparticles doped with a rare earth metal; a step (c) of forming a nanocomposite double-layer by applying a mixed solution of the first solution and the second solution onto a biocompatible natural polymer support layer; and a step (d) of forming an electrically conductive layer on the biocompatible natural polymer support layer of the nanocomposite double-layer formed in the step (c).

In a specific example, as a solvent in the first solution prepared in the step (a), an alkylbenzene-based solvent may be used, and toluene may be preferably used. The azobenzene derivative contained in the first solution may contain a vinyl group at a terminal thereof, and more specifically, may be 1-(4-(hex-5-ethyloxy)phenyl)-2-phenyldiazene.

In a specific example, as a solvent in the second solution prepared in the step (b), an alkene-based solvent or an unsaturated fatty acid-based solvent may be used, and a mixed solvent of an alkene-based solvent and an unsaturated fatty acid-based solvent may be preferably used. In this case, the alkene-based solvent may be octadecene, and the unsaturated fatty acid-based solvent may be oleic acid. As the rare earth metal contained in the second solution, a precursor in which the rare earth metal ion is combined with a salt selected from the group consisting of $Cl^-$, $Br^-$, $NO_3^-$, and $CH_3COO^-$ may be used, and a precursor in which the rare earth metal ion is combined with a salt of $Cl^-$ or $CH_3COO^-$ may be preferably used.

In a specific example, in the step (c), a nanocomposite double-layer may be formed by coating the mixed solution of the first solution and the second solution onto a biocompatible natural polymer support layer and curing the mixed solution.

The coating may be performed by a method commonly used for forming a film by applying a solution in the semiconductor field. As an example, the coating may be performed by spin coating, roll coating, spray coating, blade coating, bar coating, dip coating, or the like, but the present invention is not limited by a specific coating method.

In addition, in the step (c), the mixed solution may further contain a curing agent, and a step of curing the polydimethylsiloxane precursor polymer may be included. In this case, as the curing agent, a platinum group catalyst may be used, and specifically, chloroplatinic acid hexahydrate may be used. The platinum group catalyst is added, such that a polyfunctional vinyl-based or acetylene-based compound, which is a crosslinking agent, reacts with Si—H to proceed with a coupling reaction. In this case, since a vinyl group or an acetylene group is contained in azobenzene contained in the AzoPDMS polymer layer, the vinyl group or the acetylene group reacts with Si—H by the platinum group catalyst used as the curing agent to introduce an azobenzene side chain into a PDMS skeleton.

In a specific example, in the step (d), the electrically conductive layer may be formed by applying a metal nanowire solution. The coating may be performed by a method commonly used for forming a film by applying a solution in the semiconductor field. As an example, the coating may be performed by spin coating, roll coating, spray coating, blade coating, drop casting, or the like, and preferably, may be performed by drop casting.

The present invention provides a bioelectric stimulation system including the multi-response photosensitive nanocomposite film. More specifically, bending and light emission may be remotely controlled by light with different wavelengths, and electric pulse stimulation may be applied to a target location by bending, and at the same time, the location of the film may be detected in real time through light emission.

Hereinafter, the multi-response photosensitive nanocomposite film according to Examples of the present invention will be described.

<Example> Production of Multi-Response Photosensitive Nanocomposite Film

1. Preparation of AzoPDMS

An azobenzene derivative (1-(4-(hex-5-enyloxy)phenyl)-2-phenyldiazene) and a polydimethylsiloxane (PDMS) precursor were mixed in a toluene solvent at 110° C. for 24 hours, thereby preparing polydimethylsiloxane (AzoPDMS) to which an azobenzene derivative was bonded. At this time, Sylgard 184 silicone elastomer kit was used as a prepolymer and a curing agent, and chloroplatinic acid ($H_2PtCl_6 \cdot 6H_2O$)

was used as a catalyst for a polymerization reaction to bond a side chain of azobenzene to a PDMS skeleton.

2. Preparation of Perovskite Nanoparticles (Perovskite Quantum Dots (PQDs)) Doped with Yb or Yb and Er (1) Preparation of Cs-Oleate $Cs_2CO_3$ (0.814 g) was added to octadecene (40 mL) and oleic acid (2.5 mL), and vacuum drying was performed at 120° C. for 1 hour. Then, heating was performed to 150° C. until all $Cs_2CO_3$ was completely dissolved by a reaction with oleic acid in a $N_2$ atmosphere.

(2) Preparation of $CsPbCl_{1.5}Br_{1.5}$ Perovskite Nanoparticles

Octadecene (50 mL), oleylamine (6 mL), oleic acid (6 mL), $PbBr_2$ (0.66 g), and $PbCl_2$ (0.52 g) were placed in a flask, the solution was heated to 120° C., and the solution was heated at 120° C. in a nitrogen atmosphere for 1 hour. After the $PbCl_2$ salt was completely dissolved, the temperature was raised to 200° C. Then, oleylamine (6 mL) and oleic acid (6 mL) were injected at 200° C. to additionally increase the solubility. Then, a Cs-oleate solution (5 mL) was injected, and after 1 minute, the reaction mixture was cooled. After the cooled reaction mixture was centrifuged at 8,000 rpm for 10 minutes, the supernatant was discarded, and the particles were redispersed in n-hexane. Then, the nanoparticles were precipitated with acetone and centrifuged again, and then the nanoparticle precipitate was dried under vacuum at 60° C. for 12 hours.

(3) Preparation of $CsPbCl_{1.5}Br_{1.5}$:Er,Yb Perovskite Nanoparticles

A solution of octadecene (50 mL), oleylamine (8 mL), oleic acid (8 mL), $PbBr_2$ (0.66 g), $ErCl_3 \cdot 6H_2O$ (0.22 g), and $YbCl_3 \cdot 6H_2O$ (0.23 g) was heated to 120° C. for 1 hour. After the $PbBr_2$ and $PbCl_2$ salts were completely dissolved, the temperature was raised to 200° C. to dissolve $ErCl_3 \cdot 6H_2O$ and $YbCl_3 \cdot 6H_2O$. Then, oleylamine (6 mL) and oleic acid (6 mL) were injected at 200° C. to additionally increase the solubility. Then, a Cs-oleate solution (5 mL) was injected, and after 1 minute, the reaction mixture was cooled. After the cooled reaction mixture was centrifuged at 8,000 rpm for 10 minutes, the supernatant was discarded, and the particles were redispersed in n-hexane. Then, the nanoparticles were precipitated with acetone and centrifuged again, and then the nanoparticle precipitate was dried under vacuum at 60° C. for 12 hours.

3. Preparation of $NaYF_4$:Yb,Er Nanoparticles (NPs)

Octadecene (45 mL), oleic acid (18 mL), $Yb(CH_3COO)_3 \cdot 3H_2O$ (1.25 g), and $Er(CH_3COO)_3 \cdot 3H_2O$ (0.03 g) were placed in a flask, the solution was heated to 160° C. for 30 minutes, and then the heated solution was cooled to 35° C. Then, sodium oleate (2.112 g) was added and stirring was performed for 10 minutes. Thereafter, a solution obtained by dissolving ammonium fluoride (0.44 g) and sodium hydroxide (0.023 g) in methanol (30 ml) was added dropwise to the solution to form nano-sized sodium fluoride. After stirring for 30 minutes, methanol was evaporated at 100° C. Then, the solution was reacted at 300° C. for 1 hour and cooled at room temperature. The synthesized nanoparticles were precipitated with ethanol and centrifuged at 8,000 rpm for 10 minutes. Then, the supernatant was discarded, and the particles were reprecipitated with ethanol and centrifuged to remove residual impurities. The purified nanoparticle precipitate was dispersed in cyclohexane.

4. Production of AzoPDMS/Silk Fibroin/Silver Nanowire Electrically Conductive Layer Film Containing Nanoparticles (PQDs or Nps)

A photoresist was spin-coated onto a wafer at 3,000 rpm for 30 seconds and cured at 120° C. for 2 minutes. Then, a silk fibroin solution was dropped onto the photoresist and dried for 12 hours. In order to synthesize an AzoPDMS composite to which $CsPbCl_{1.5}Br_{1.5}$ PQDs or $NaYF_4$:Yb,Er NPs doped with rare earth elements were bonded, 5 mL of a solution of $CsPbCl_{1.5}Br_{1.5}$:Yb,Er PQDs or $NaYF_4$:Yb,Er NPs was added dropwise to 1 g of an AzoPDMS prepolymer. 0.1 g of a curing agent was added as a crosslinking agent and degassed in a desiccator for several hours. Thereafter, AzoPDMS to which $CsPbCl_{1.5}Br_{1.5}$:Yb, Er PQDs or $NaYF_4$:Yb, Er NPs were bonded was spin-coated to a silk fibroin film at 2,000 rpm for 1 minute. The film was cured at 80° C. for 24 hours to form an AzoPDMS/silk fibroin double-layer film. Thereafter, the photoresist was removed with acetone, a silver nanowire (AgNW) solution was dropcasted on the silk fibroin side of the film, the solvent was dried, and then an AzoPDMS/silk fibroin/silver nanowire electrically conductive layer film doped with nanoparticles (PQDs or NPs) was finally produced.

<Experimental Example 1> Structure of Nanocomposite Film

Figure 2:
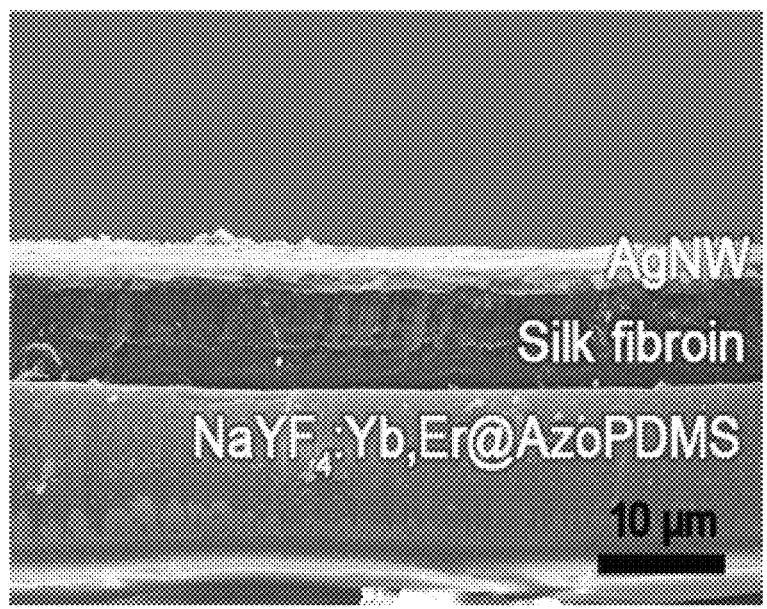
FIG. 2 is a cross-sectional image of an AzoPDMS/silk fibroin/AgNW film doped with $NaYF_4$:Yb,Er nanoparticles (NPs) observed with a scanning electron microscope (SEM).

FIG. 2 illustrates a cross-sectional image of an AzoPDMS/silk fibroin/AgNW film doped with $NaYF_4$:Yb, Er NPs observed with a scanning electron microscope (SEM). Through this, a structure of an AzoPDMS layer doped with $NaYF_4$:Yb,Er NPs having a thickness of 10.09 μm, which was coated on a silk fibroin layer having a thickness of 6.90 μm, was confirmed.

Figure 3:
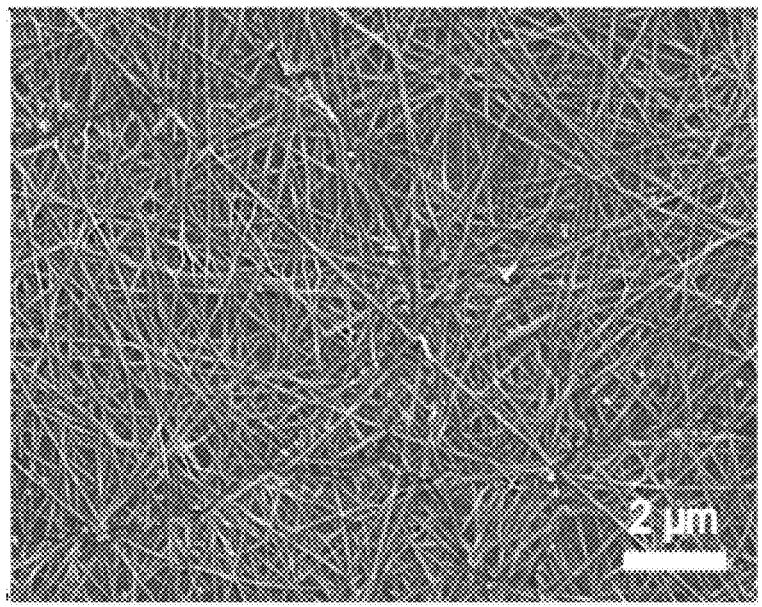
FIG. 3 is a front image of an AgNW layer observed with the SEM.

In addition, FIG. 3 illustrates a front image of the AgNW layer observed with the SEM. Through this, it could be confirmed that a film in which one side was conductive was produced because a network structure in which the nanowires were densely connected was exhibited.

Figure 4:
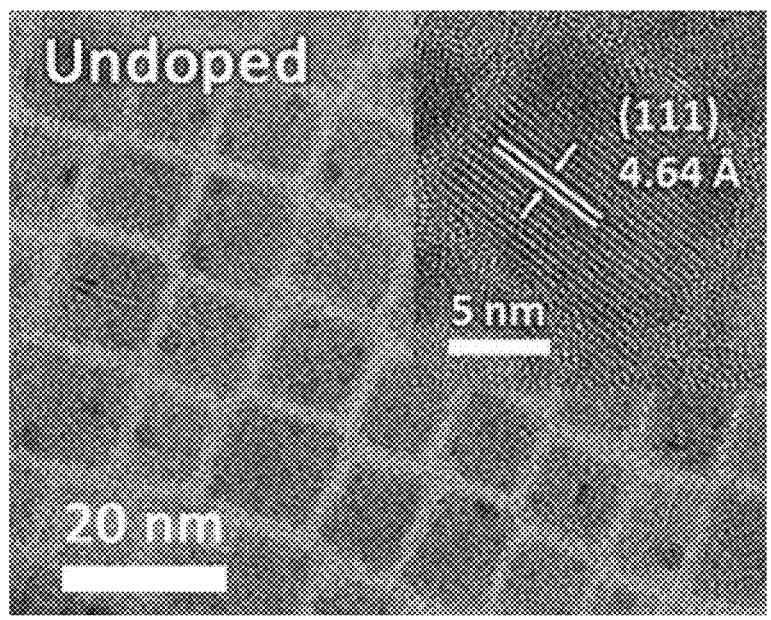
FIG. 4 is image of $CsPbCl_{1.5}Br_{1.5}$ observed with a transmission electron microscope (TEM).
Figure 5:
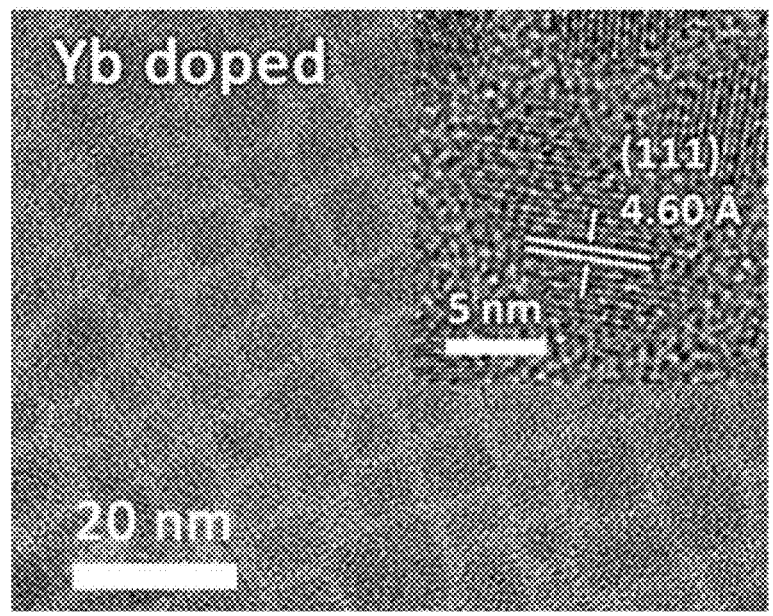
FIG. 5 is image of $CsPbCl_{1.5}Br_{1.5}$:Yb observed with a transmission electron microscope (TEM).
Figure 6:
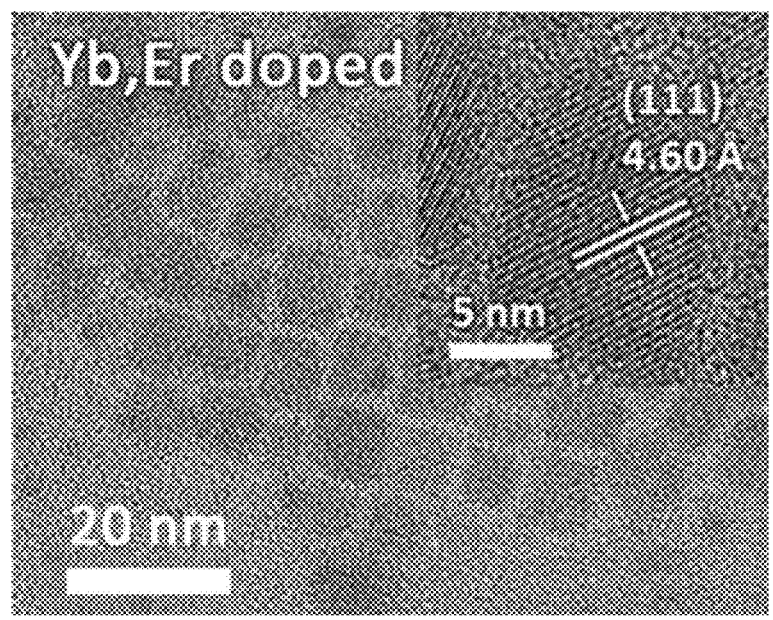
FIG. 6 is image of $CsPbCl_{1.5}Br_{1.5}$:Yb,Er perovskite quantum dots (PQDs) observed with a transmission electron microscope (TEM).

FIGS. 4 to 6 illustrate images of $CsPbCl_{1.5}Br_{1.5}$, $CsPbCl_{1.5}Br_{1.5}$:Yb, and $CsPbCl_{1.5}Br_{1.5}$:Yb, Er PQDs observed with a transmission electron microscope (TEM), respectively. Through this, it could be confirmed that the sizes of $CsPbCl_{1.5}Br_{1.5}$, $CsPbCl_{1.5}Br_{1.5}$:Yb, $CsPbCl_{1.5}Br_{1.5}$:Yb,Er PQDs were 10.07±1.07 nm, 7.81±1.07 nm, and 8.50±1.03 nm, respectively. The difference in the size of PQDs in the case where the rare earth elements were doped and the case where the rare earth elements were not doped was caused by the difference in the size between $Pb^{2+}$, $Yb^{3+}$, and $Er^{3+}$. It could be confirmed that the crystal structure became denser and the interplanar distance was decreased because the $Pb^{2+}$ ions were replaced by the smaller $Yb^{3+}$ and $Er^{3+}$ ions.

Figure 7:
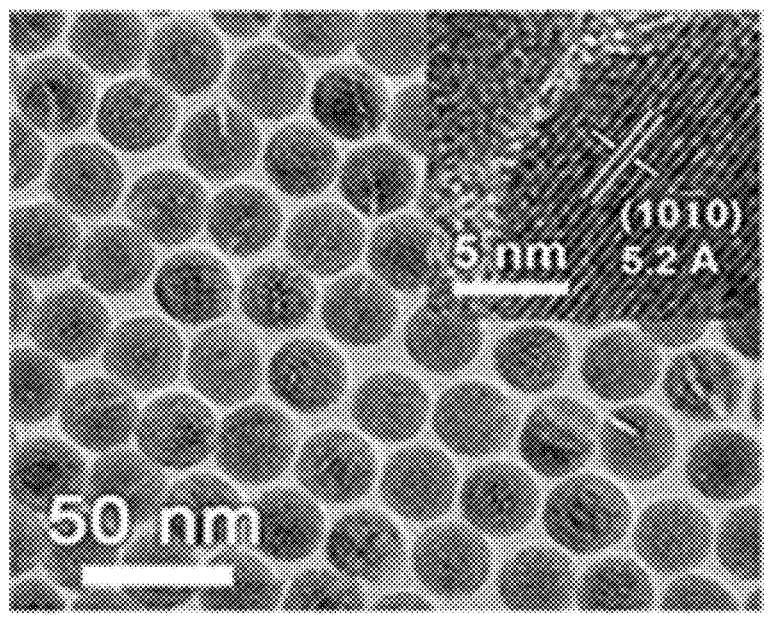
FIG. 7 is image of $NaYF_4$:Yb,Er observed with the TEM.
Figure 8:
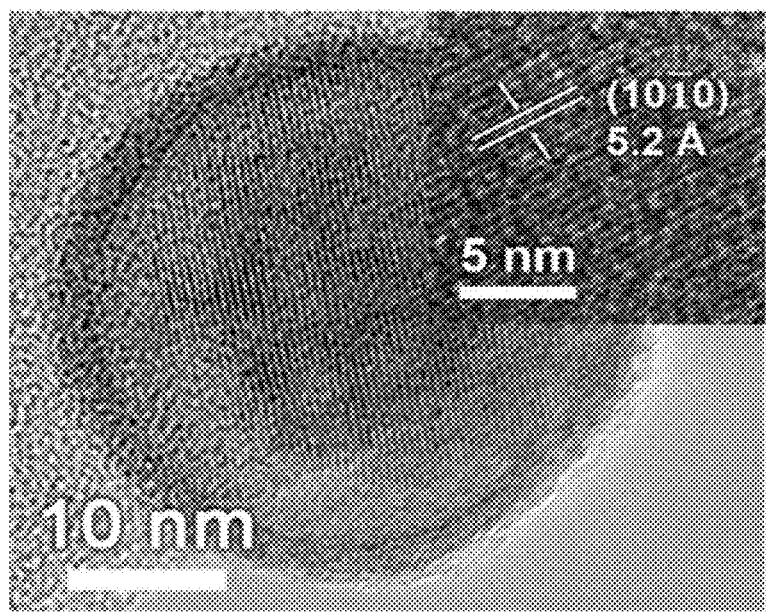
FIG. 8 is image of $NaYF_4$:Yb,Er@$NaLuF_4$ NPs observed with the TEM.

FIGS. 7 and 8 are images of $NaYF_4$:Yb,Er and $NaYF_4$:Yb,Er@$NaLuF_4$ NPs observed with the TEM, respectively. Through this, it could be confirmed that the sizes of $NaYF_4$:Yb,Er and $NaYF_4$:Yb,Er@$NaLuF_4$ NPs were 24.4±0.7 nm and 31.9±3.4 nm, respectively.

<Experimental Example 2> Bending Properties of Nanocomposite Film

Figure 9:
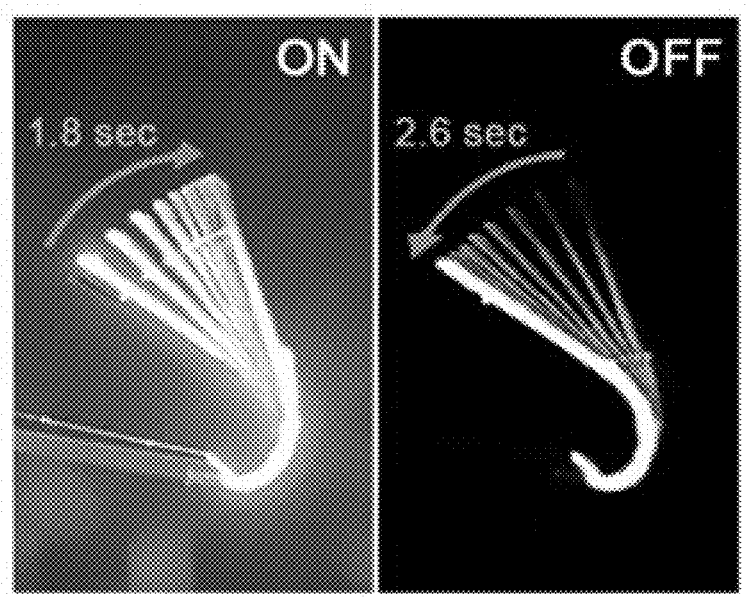
FIG. 9 is an optical image showing bending properties when the AzoPDMS/silk fibroin/AgNW film doped with $NaYF_4$:Yb,Er NPs is irradiated with visible light.

FIG. 9 is an optical image showing bending properties when the AzoPDMS/silk fibroin film doped with $NaYF_4$:Yb,Er NPs is irradiated with visible light.

It could be confirmed that when the film was irradiated with light having a wavelength of 400 to 700 nm with an electric power of 51.12 mW, a bending phenomenon occurred gradually up to 40.5° within a few seconds, and when the light source was removed, the film was returned to its initial shape.

Figure 10:
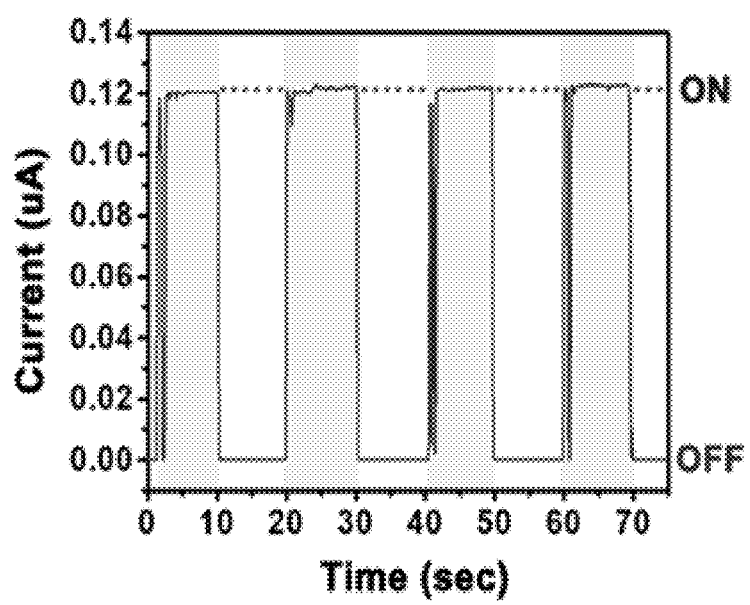
FIG. 10 is a graph showing electrical ON/OFF switch characteristics due to bending of the film when the AzoPDMS/silk fibroin/AgNW film doped with $NaYF_4$:Yb,Er NPs is periodically irradiated with visible light having a wavelength of 400 to 700 nm.

FIG. 10 is a graph showing electrical ON/OFF switch characteristics due to bending of the film when the AzoPDMS/silk fibroin/AgNW film doped with NaYF$_4$:Yb,Er NPs is periodically irradiated with visible light having a wavelength of 400 to 700 nm.

Electrical switching was performed by adding a silver nanowire (AgNW) layer to the silk fibroin layer. An electrical ON/OFF state was activated by bending of the nanocomposite film with one side fixed to one electrode and the other side in contact with the other electrode. In the electrical circuit using the AzoPDMS/silk fibroin/AgNW film doped with NaYF$_4$:Yb,Er NPs, it could be confirmed that a reversible ON/OFF cycle was shown, and the delay in the reaction time of ON→OFF compared to OFF→ON was caused by the difference in the reaction time of cis-trans conversion.

Figure 11:
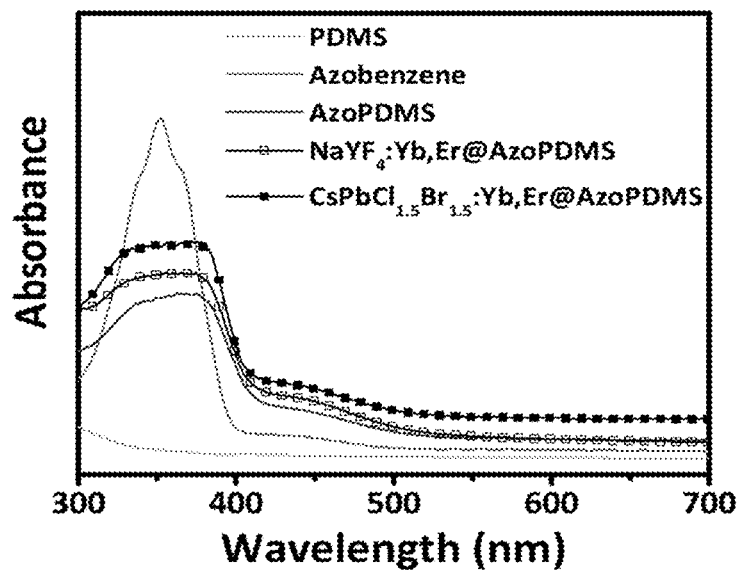
FIG. 11 is a graph of absorption spectra of PDMS, azobenzene, AzoPDMS, AzoPDMS/silk fibroin doped with $CsPbCl_{1.5}Br_{1.5}$:Yb,Er PQDs, and AzoPDMS/silk fibroin doped with $NaYF_4$:Yb,Er NPs through UV-Vis.

FIG. 11 is a graph of absorption spectra of PDMS, azobenzene, AzoPDMS, AzoPDMS/silk fibroin doped with CsPbCl$_{1.5}$Br$_{1.5}$:Yb,Er PQDs, and AzoPDMS/silk fibroin doped with NaYF$_4$:Yb,Er NPs through UV-Vis.

It could be confirmed that the graphs of AzoPDMS, AzoPDMS/silk fibroin doped with CsPbCl$_{1.5}$Br$_{1.5}$:Yb,Er PQDs, and AzoPDMS/silk fibroin doped with NaYF$_4$:Yb,Er NPs were similar to each other, which showed that CsPbCl$_{1.5}$Br$_{1.5}$:Yb,Er PQDs or NaYF$_4$:Yb,Er NPs did not significantly affect the light absorption of AzoPDMS.

In the case of AzoPDMS, the maximum absorbance appeared at 363 nm, which was almost the same as the wavelength exhibiting the maximum absorbance in azobenzene, whereas such a peak did not appear in PDMS. This means that azobenzene is well bonded in PDMS while AzoPDMS maintains the optical properties of azobenzene.

In addition, in the case of AzoPDMS, broad peaks appeared at 363 nm and 450 nm, which showed that the trans and cis forms of azobenzene were predominant, respectively. The peak at 363 nm and the prominent peak at 450 nm compared to azobenzene showed that most of the azobenzene molecules bonded to PDMS were initially in the cis form. These results showed that the nanocomposite film was bent through cis-trans deformation by irradiation with light having a wavelength of 400 to 700 nm, and was returned to the cis form again when the light was removed.

<Experimental Example 3> Light EMISSION Properties of Nanocomposite Film

In the case of CsPbCl$_{1.5}$Br$_{1.5}$:Yb,Er PQDs or NaYF$_4$:Yb,Er NPs, an Yb—Er system was formed in the perovskite or NaYF$_4$ crystal structure, resulting in upconversion light emission.

Figure 12:
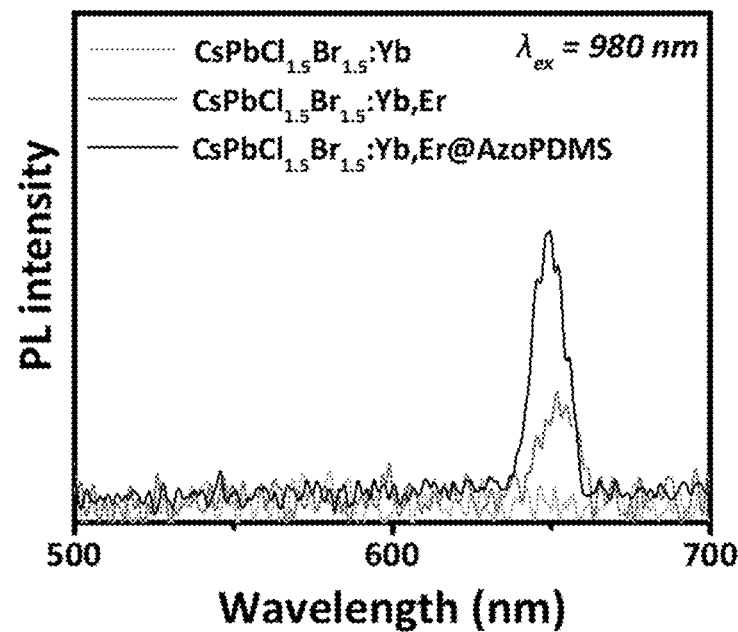
FIG. 12 is a graph of light emission spectra of $CsPbCl_{1.5}Br_{1.5}$:Yb and $CsPbCl_{1.5}Br_{1.5}$:Yb,Er PQDs, and AzoPDMS/silk fibroin doped with $CsPbCl_{1.5}Br_{1.5}$:Yb,Er PQDs when irradiated with a near-infrared light having a wavelength of 980 nm.

FIG. 12 is a graph of light emission spectra of CsPbCl$_{1.5}$Br$_{1.5}$:Yb and CsPbCl$_{1.5}$Br$_{1.5}$:Yb,Er PQDs, and AzoPDMS/silk fibroin doped with CsPbCl$_{1.5}$Br$_{1.5}$:Yb,Er PQDs when irradiated with a near-infrared light having a wavelength of 980 nm.

In the case of the CsPbCl$_{1.5}$Br$_{1.5}$ PQDs, no light emission in the visible light range was generated at light having a wavelength of 980 nm, and no light emission in the visible light range was generated even when only Yb$^{3+}$ acting as a photosensitizer absorbing a photon having a wavelength of 980 nm was doped. When Er$^{3+}$ capable of acting as an emitter was additionally introduced into CsPbCl$_{1.5}$Br$_{1.5}$:Yb PQDs, visible light emission induced by near-infrared light was generated by upconversion between the doped elements (Yb$^{3+}$ and Er$^{3+}$). In both the cases of the AzoPDMS/silk fibroin films in which CsPbCl$_{1.5}$Br$_{1.5}$:Yb,Er PQDs and CsPbCl$_{1.5}$Br$_{1.5}$:Yb,Er PQDs were contained, when light having a wavelength of 980 nm was applied, light emission was generated at 648 nm, which showed that the upconversion properties were maintained even inside the polymer.

<Experimental Example 4> Bending and Light Emission Properties of Nanocomposite Film An Yb—Er system was also formed in NaYF$_4$ transparent nanoparticles by doping, and the synthesized NaYF$_4$:Yb,Er nanoparticles were covered with an optically inert NaLuF$_4$ shell to improve optical properties. In the case of NaYF$_4$:Yb,Er, when light having a wavelength of 980 nm was radiated, light emission at 520.4, 540.8, and 654.8 nm was generated through upconversion due to energy transfer between Yb$^{3+}$ and Er$^{3+}$.

Figure 13:
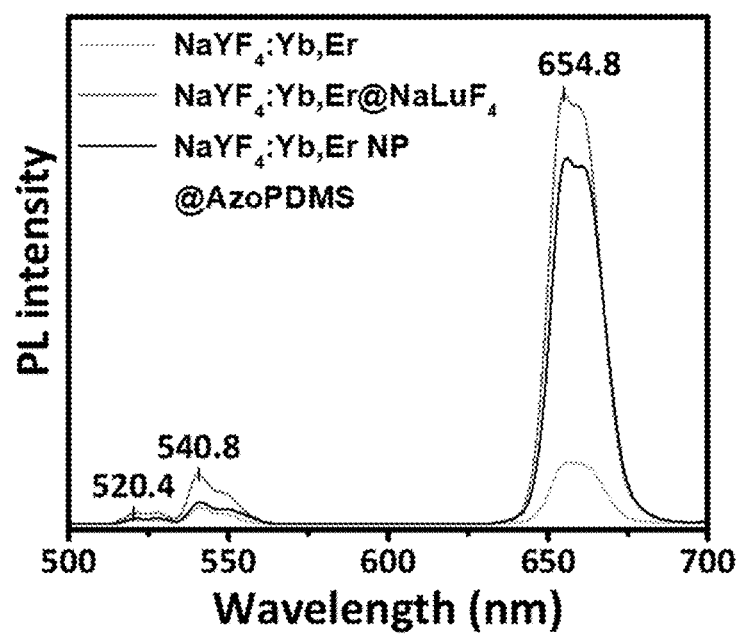
FIG. 13 is a graph of light emission spectra of $NaYF_4$:Yb,Er, $NaYF_4$:Yb,Er@$NaLuF_4$, and AzoPDMS doped with $NaYF_4$:Yb,Er when irradiated with a near-infrared light having a wavelength of 980 nm.
Figure 14:
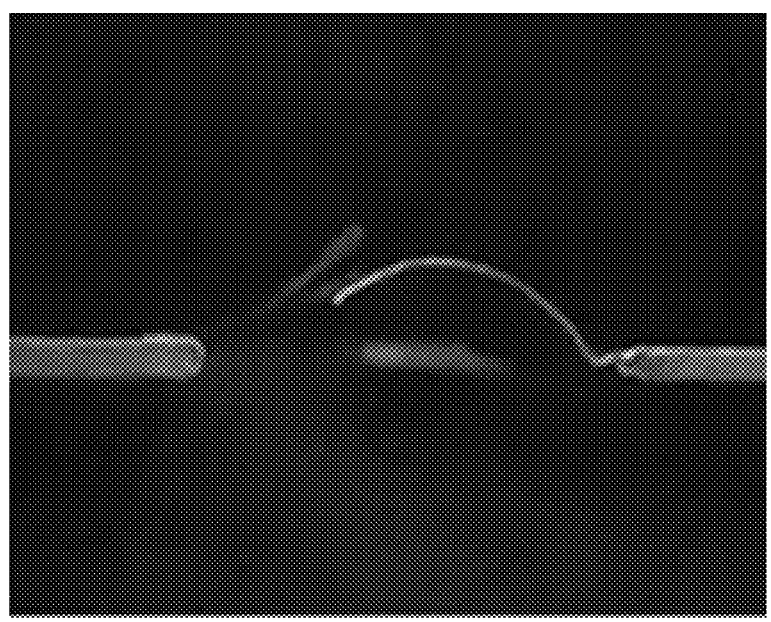
FIGS. 14 to 17 are optical images showing four independent multi-states of an initial state, a bending state, a bending and light emission state, and a light emission state generated by a combination of bending and light emission, respectively, when irradiated with near-infrared light having a wavelength of 980 nm and visible light having a wavelength of 400 to 700 nm.
Figure 15:
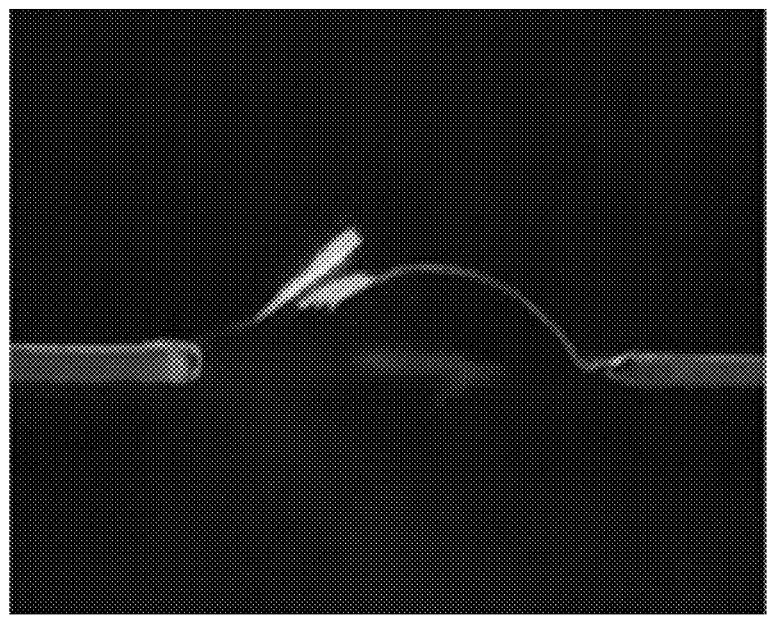
Figure 16:
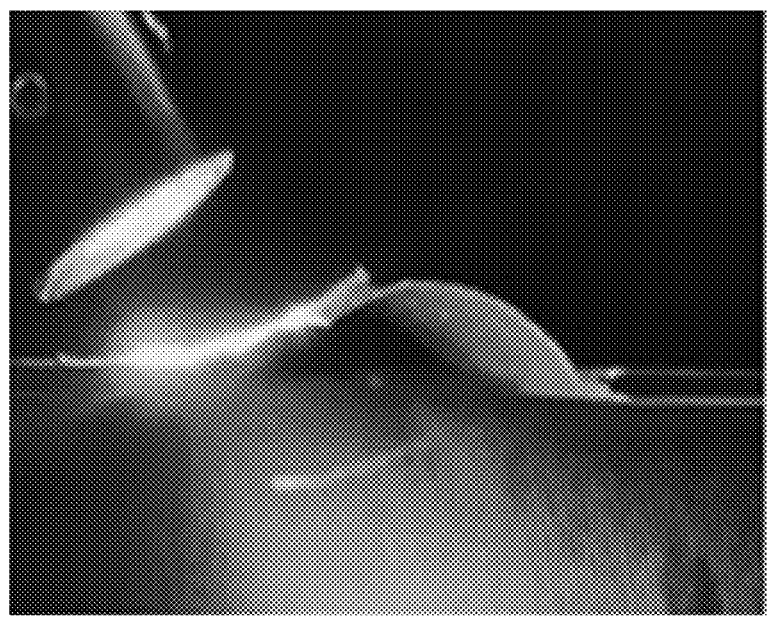
Figure 17:
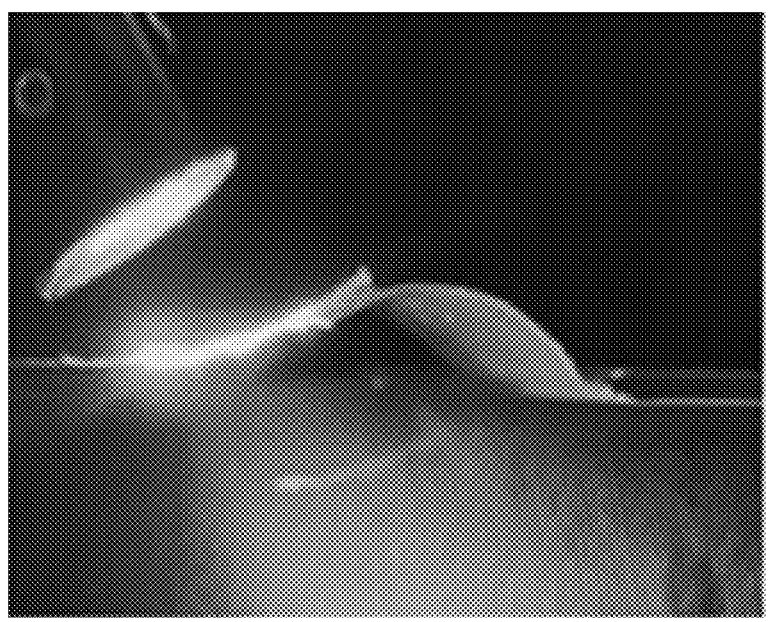

FIG. 13 is a graph of light emission spectra of NaYF$_4$:Yb,Er, NaYF$_4$:Yb,Er@NaLuF$_4$, and AzoPDMS doped with NaYF$_4$:Yb,Er when irradiated with a near-infrared light having a wavelength of 980 nm.

In the cases of NaYF$_4$:Yb,Er, NaYF$_4$:Yb,Er@NaLuF$_4$, and AzoPDMS doped with NaYF$_4$:Yb,Er, when light having a wavelength of 980 nm was radiated, light emission peaks appeared at 520.4, 540.8, and 654.8 nm, respectively, which corresponded to $^4H_{11/2}$—$^4I_{15/2}$, $^4S_{3/2}$—$^4I_{15/2}$, and $^4F_{9/2}$—$^4I_{15/2}$ energy transfers of Er$^{3+}$, respectively.

The nanocomposite film is operated as an electrical switch together with a location indicator. More specifically, through precisely controlled bending and light emission, the location of the film may be monitored in real time, and at the same time, the change in shape may be induced with the electrical switch. When the location of the film is detected by irradiating light having a wavelength of 980 nm and then light having a wavelength of 400 to 700 nm is radiated, the electrical switch is operated by bending of the film, and thus electrical stimulation is applied.

FIGS. 14 to 17 are optical images showing four independent multi-states of an initial state, a bending state, a bending and light emission state, and a light emission state generated by a combination of bending and light emission, respectively, when irradiated with near-infrared light having a wavelength of 980 nm and visible light having a wavelength of 400 to 700 nm.

The initial state appears when no light is applied, the bending appears when only visible light having a wavelength of 400 to 700 nm is radiated, the bending and light emission appear when near-infrared light having a wavelength of 980 nm and visible light having a wavelength of 400 to 700 nm are radiated, and the light emission appears when only near-infrared light having a wavelength of 980 nm is radiated. The two types of light sources did not affect each other's opposite properties. Therefore, the possibility of independent real-time operation of the location detection and the electrical stimulation was confirmed through the independent multi-state execution.

Figure 18:
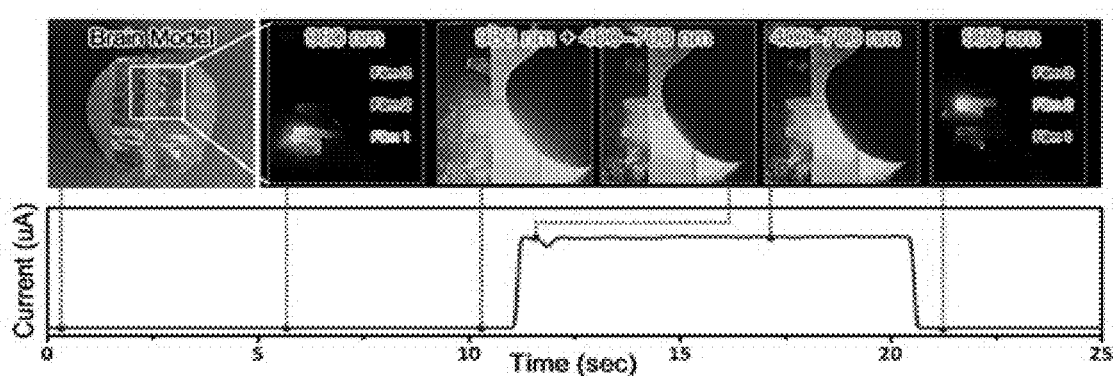
FIG. 18 illustrates an optical image and a current graph of sequential location detection and electrical stimulation implemented on a brain model as a bioelectrical stimulation system when irradiated with near-infrared light having a wavelength of 980 nm and visible light having a wavelength of 400 to 700 nm.

FIG. 18 illustrates an optical image and a current graph of sequential location detection and electrical stimulation implemented on a brain model as a bioelectrical stimulation system when irradiated with near-infrared light having a wavelength of 980 nm and visible light having a wavelength of 400 to 700 nm.

The nanocomposite film formed of light emission nanoparticles and a photoreactive polymer functions as an electrical switch that may be temporally and spatially controlled. The change in shape of the film through bending is monitored by applying electrical pulse stimulation when visible light having a wavelength of 400 to 700 nm is radiated, and the light emission of the nanoparticles dispersed in the film is monitored by detecting the location of the film in real time when near-infrared light having a wavelength of 980 nm is radiated. Therefore, electrical stimulation is applied to the film under desired conditions at a target location according to spatiotemporal-controlled bending and light emission.

It was confirmed through the graph of FIG. 13 that when near-infrared light having a wavelength of 980 nm was radiated, light emission in the visible light range was generated by upconversion. It was confirmed through FIG. 10 that when visible light having a wavelength of 400 to 700 nm was radiated, the properties of repeated cycles of the electrical switch were exhibited due to the bending of the film.

Based on this, a spatiotemporal-controlled bioelectrical stimulation process was performed by arranging three films, and each step was performed for 5 seconds. First, an initial state was observed, a location of the film was detected by irradiating near-infrared having a wavelength of 980 nm, bending was induced in the film whose location was detected by adding visible light having a wavelength of 400 to 700 nm to apply electrical stimulation, and the near-infrared having a wavelength of 980 nm was removed. This process was also performed for the films in different locations.

Figure 19:
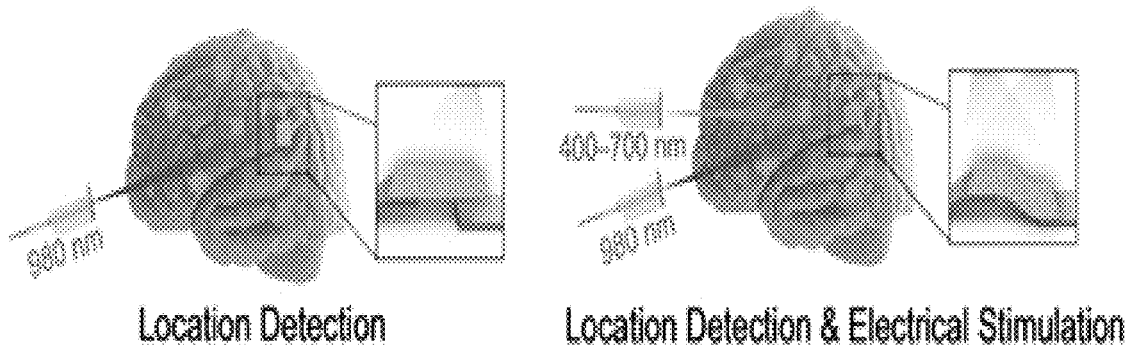
FIG. 19 is a view illustrating that the location detection and the electrical stimulation may be performed independently at the same time when irradiated with near-infrared light having a wavelength of 980 nm and visible light having a wavelength of 400 to 700 nm.

FIG. 19 is a view illustrating that the location detection and the electrical stimulation may be performed independently at the same time when irradiated with near-infrared light having a wavelength of 980 nm and visible light having a wavelength of 400 to 700 nm.

Such a nanocomposite film may be applied as a bioelectrical stimulation system for activating the skin surface and nerves (such as the spinal cord) or muscle cells that are difficult to access internally during open surgery, or for treating local areas of organs or tissues. Since light is used as a stimulus, it is possible to perform spatiotemporally precise treatment by simultaneously performing remote control and real-time location detection without physical contact. In particular, low-frequency electrical stimulation (to 0.53 Hz) may be applied, and thus the nanocomposite film is suitable for the treatment of the noradrenergic system. In recent clinical deep brain treatment, indirect electrical stimulation applied to the earlobe or invasive electrical stimulation through permanent electrode implantation is applied. On the other hand, a non-invasive stimulus may be applied with higher spatial accuracy by utilizing the present invention. Through the development of flexible conductive materials, electrodes may be contacted only when needed, and visible light emission may be monitored in real time with naked eyes or a laparoscopic camera, which may compensate for location inaccuracy caused by body movements and may thus greatly reduce side effects and complexity of treatment. When photoreactive molecules (such as azobenzene) are replaced by near-infrared reactive molecules that may penetrate the skin, it may be extended to non-surgical treatment controlled inside the skin. The bioelectrical stimulation system implemented by the present invention may precisely control the roles of a real-time location indicator and an electric pulse stimulator at the same time in an independent and spatiotemporal manner, and thus is used for accurate and non-invasive electrosurgical treatment.

As set forth above, the multi-response photosensitive nanocomposite film of the present invention may induce independent bending and light emission when light stimuli with different wavelengths are applied, such that electrical stimulation and location detection may be independently controlled in vivo.

Therefore, the spirit of the present invention should not be limited to the described exemplary embodiments, but the claims and all modifications equal or equivalent to the claims are intended to fall within the spirit of the present invention.

What is claimed is:

1. A multi-response photosensitive nanocomposite film comprising:
    an electrically conductive layer;
    a biocompatible natural polymer support layer disposed on the electrically conductive layer; and
    a polydimethylsiloxane (AzoPDMS) polymer layer disposed on the biocompatible natural polymer support layer and containing an azobenzene group,
    the electrically conductive layer, the biocompatible natural polymer support layer, and the AzoPDMS polymer layer being sequentially disposed,
    wherein nanoparticles doped with a rare earth metal are included in the AzoPDMS polymer layer.

2. The multi-response photosensitive nanocomposite film of claim 1, wherein the electrically conductive layer has a network structure of metal nanowires.

3. The multi-response photosensitive nanocomposite film of claim 1, wherein the rare earth metal is selected from the group consisting of La, Ce, Pr, Nd, Pm, Sm, Edu, Gd, Tb, Dy, Ho, Er, Tm, Yb, and Lu.

4. The multi-response photosensitive nanocomposite film of claim 1, wherein the nanoparticles are perovskite quantum dots (PQDs).

5. The multi-response photosensitive nanocomposite film of claim 4, wherein crystal particles of the perovskite quantum dots have a structure of the following Chemical Formula 1:

$$ABX_aZ_{3-a} \qquad \text{<Chemical Formula 1>}$$

in Chemical Formula 1, A is a monovalent metal cation, B is a divalent metal cation, X and Z are halogen ions, and a is a real number of 0 to 3.

6. The multi-response photosensitive nanocomposite film of claim 1, wherein the nanoparticles are transparent nanoparticles.

7. The multi-response photosensitive nanocomposite film of claim 6, wherein the transparent nanoparticles contain a compound represented by $MYF_4$ (M is an alkali metal).

8. The multi-response photosensitive nanocomposite film of claim 1, wherein in the multi-response photosensitive nanocomposite film, a bending phenomenon occurs by a light stimulus, and when the light stimulus is removed, the bending phenomenon is reversibly removed.

9. The multi-response photosensitive nanocomposite film of claim 8, wherein the light stimulus is a visible light source.

10. The multi-response photosensitive nanocomposite film of claim 1, wherein the nanoparticles doped with the rare earth metal have visible light emission properties by a near-infrared light stimulus.

11. The multi-response photosensitive nanocomposite film of claim 10, wherein a bending phenomenon occurs by a light stimulus of the emitted visible light.

12. A method of producing a multi-response photosensitive nanocomposite film, the method comprising the steps of:
    step (a) preparing a first solution containing an azobenzene derivative and a polydimethylsiloxane precursor polymer;
    step (b) preparing a second solution containing nanoparticles doped with a rare earth metal;

step (c) forming a nanocomposite double-layer by applying a mixed solution of the first solution and the second solution onto a biocompatible natural polymer support layer; and step (d) forming an electrically conductive layer on the biocompatible natural polymer support layer of the nanocomposite double-layer formed in step (c).

13. The method of claim 12, wherein the azobenzene derivative contains a vinyl group at a terminal thereof.

14. The method of claim 12, wherein in step (c), the mixed solution further contains a curing agent, and a step of curing the polydimethylsiloxane precursor polymer is included.

15. The method of claim 12, wherein the electrically conductive layer is formed by applying a metal nanowire solution.

16. A bioelectric stimulation system comprising the multi-response photosensitive nanocomposite film of claim 1.

* * * * *